(12) United States Patent
Kikushima et al.

(10) Patent No.: US 10,056,400 B2
(45) Date of Patent: Aug. 21, 2018

(54) STACKED SEMICONDUCTOR DEVICE

(71) Applicant: TOSHIBA MEMORY CORPORATION, Minato-ku (JP)

(72) Inventors: Fumie Kikushima, Yokkaichi (JP); Keisuke Kikutani, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/059,653

(22) Filed: Mar. 3, 2016

(65) Prior Publication Data

US 2017/0069644 A1 Mar. 9, 2017

Related U.S. Application Data

(60) Provisional application No. 62/215,480, filed on Sep. 8, 2015.

(51) Int. Cl.

| | |
|---|---|
| *H01L 27/11551* | (2017.01) |
| *H01L 27/11556* | (2017.01) |
| *H01L 21/311* | (2006.01) |
| *H01L 21/3213* | (2006.01) |
| *H01L 21/28* | (2006.01) |
| *H01L 21/768* | (2006.01) |
| *H01L 27/11578* | (2017.01) |
| *H01L 27/11514* | (2017.01) |

(52) U.S. Cl.
CPC .. *H01L 27/11556* (2013.01); *H01L 21/28273* (2013.01); *H01L 21/31111* (2013.01); *H01L 21/32133* (2013.01); *H01L 21/76877* (2013.01); *H01L 27/11514* (2013.01); *H01L 27/11551* (2013.01); *H01L 27/11578* (2013.01)

(58) Field of Classification Search
CPC ......... H01L 27/11551; H01L 27/11578; H01L 27/11514; H01L 27/11556; H01L 27/11582

See application file for complete search history.

(56) References Cited

U.S. PATENT DOCUMENTS

| | | | |
|---|---|---|---|
| 8,198,667 B2 | 6/2012 | Kuniya et al. | |
| 8,946,808 B2 | 2/2015 | Lee et al. | |
| 2010/0207185 A1* | 8/2010 | Lee | H01L 21/28282 257/314 |
| 2012/0273865 A1* | 11/2012 | Lee | H01L 27/11582 257/316 |

(Continued)

FOREIGN PATENT DOCUMENTS

JP 2011-23586 2/2011

*Primary Examiner* — Phat X Cao
(74) *Attorney, Agent, or Firm* — Oblon, McClelland, Maier & Neustadt, L.L.P.

(57) ABSTRACT

According to one embodiment, a semiconductor device includes a semiconductor substrate, a stacked body, and a first insulating film. The stacked body is provided on the semiconductor substrate. The stacked body includes first films, and second films being conductive. The first films and the second films are stacked alternately. The first insulating film extends in a stacking direction of the stacked body. The second films include a first portion and a second portion. The first portion is positioned between the first films. The second portion has a surface contacting the first insulating film in a direction perpendicular to the stacking direction.

17 Claims, 20 Drawing Sheets

(56) References Cited

U.S. PATENT DOCUMENTS

| | | | | |
|---|---|---|---|---|
| 2013/0248965 A1* | 9/2013 | Nakai | ................... | H01L 29/788 257/315 |
| 2013/0292757 A1* | 11/2013 | Aritome | ............ | H01L 27/11556 257/316 |
| 2016/0071855 A1* | 3/2016 | Park | .................. | H01L 27/11556 257/314 |

* cited by examiner

STACKED SEMICONDUCTOR DEVICE

CROSS-REFERENCE TO RELATED APPLICATIONS

This application is based upon and claims the benefit of priority from U.S. Provisional Patent Application 62/215,480 field on Sep. 8, 2015; the entire contents of which are incorporated herein by reference.

FIELD

Embodiments described herein relate generally to a semiconductor device and a method for manufacturing the same.

BACKGROUND

As the integration of a semiconductor device becomes high, interconnect spacing in the interior of the semiconductor device becomes narrow; and there is a risk that a leakage current may occur between the interconnects. For example, in a stacked semiconductor memory device, an interconnect region is formed by making through-holes and trenches in a stacked body and by dividing an array of memory cells into block units. In the case where the interconnects are formed by forming the desired material as a film in the through-holes and the trenches, it is difficult to form the interconnects uniformly inside the stacked body. Also, there are cases where such through-holes and trenches become finer toward the lower layers; and fluctuation occurs easily between the upper layers and the lower layers in the interconnect region. Thereby, a difference of the programming speed of the data occurs between interconnect regions; and discrepancies of the memory operations undesirably occur.

DETAILED DESCRIPTION

Figure 1A:
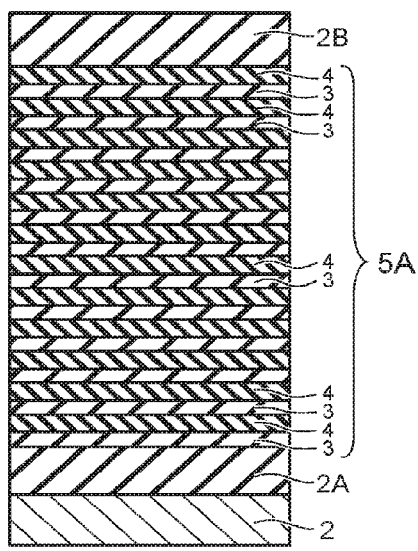
FIG. 1A to FIG. 1F are cross-sectional views of processes, showing an interconnect formation method of a semiconductor device according to a first embodiment.

According to one embodiment, a semiconductor device includes a semiconductor substrate, a stacked body, and a first insulating film. The stacked body is provided on the semiconductor substrate. The stacked body includes first films, and second films being conductive. The first films and the second films are stacked alternately. The first insulating film extends in a stacking direction of the stacked body. The second films include a first portion and a second portion. The first portion is positioned between the first films. The second portion has a surface contacting the first insulating film in a direction perpendicular to the stacking direction.

Embodiments will now be described with reference to the drawings. The same components in the drawings are marked with the same reference numerals.

First Embodiment

FIG. 1A to FIG. 1F are cross-sectional views of processes, showing an interconnect formation method of a semiconductor device according to a first embodiment.

Figure 1B:
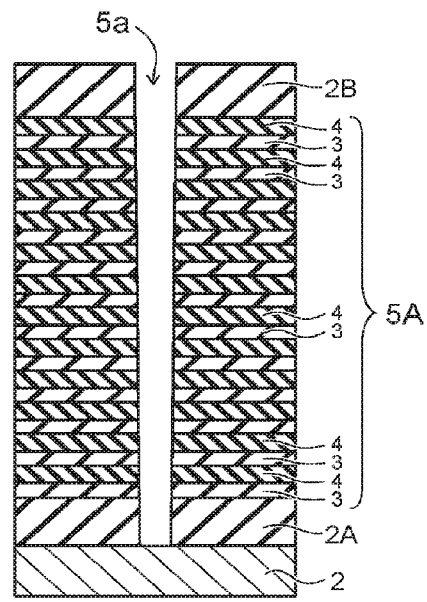
Figure 1C:
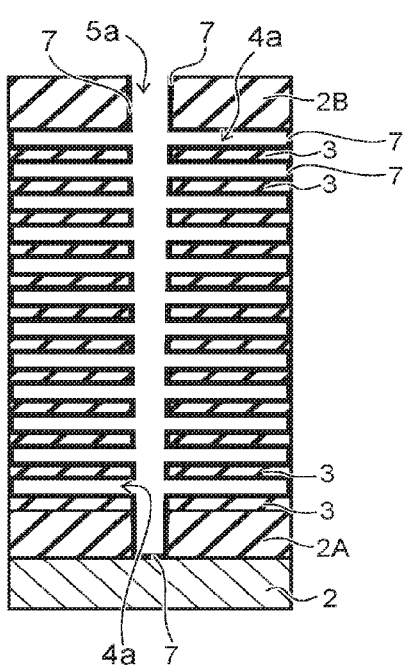
Figure 1D:
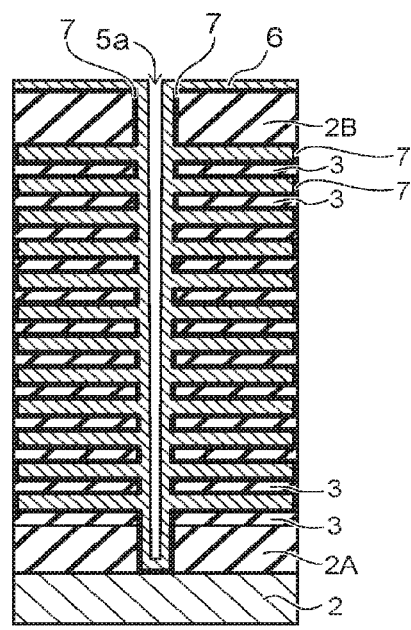
Figure 1E:
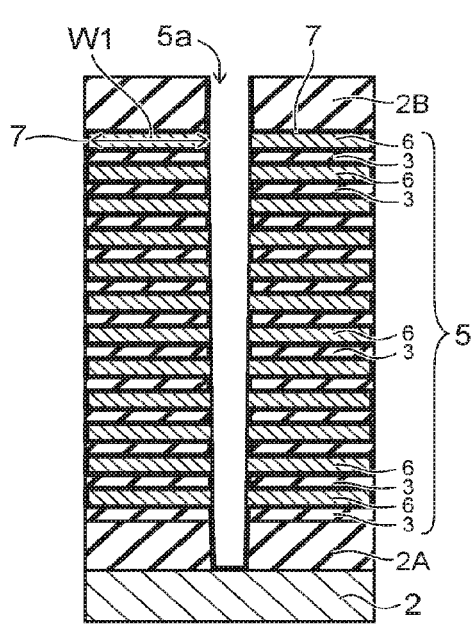
Figure 2A:
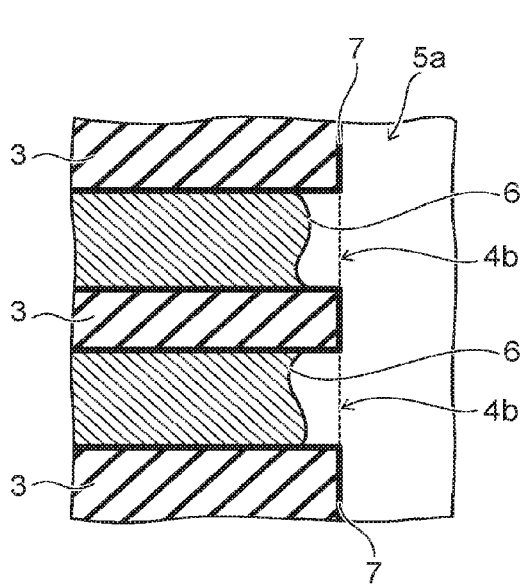
FIG. 2A to FIG. 2C are enlarged cross-sectional views describing a film formation process of FIG. 1E.
Figure 2B:
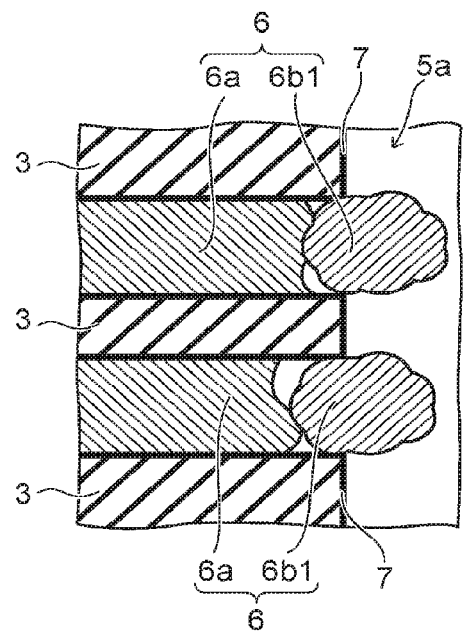
Figure 2C:
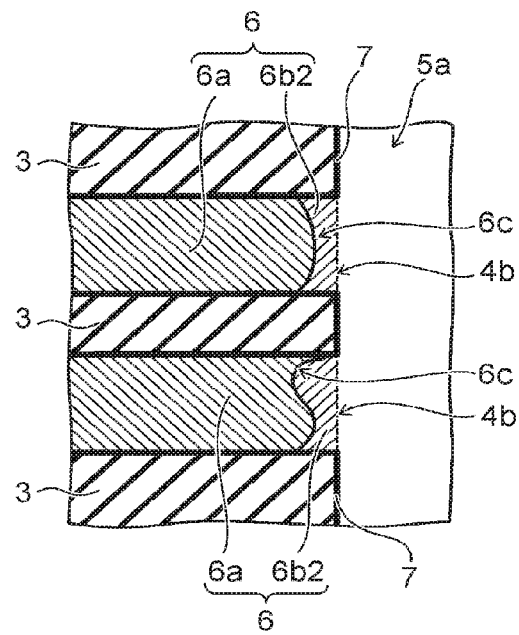

FIG. 2A to FIG. 2C are enlarged cross-sectional views describing a film formation process of FIG. 1E.

As shown in FIG. 1A, a stacked body 5A is formed on a substrate 2 by alternately stacking insulating films 3 and sacrificial films 4. The substrate 2 is, for example, a semiconductor substrate such as a silicon (Si) substrate, etc. The insulating films 3 and the sacrificial films 4 are, for example, films including a silicon compound. For example, silicon oxide films and silicon nitride films are stacked alternately. For example, the insulating films 3 and the sacrificial films 4 are stacked to have any number of stacks by CVD (Chemical Vapor Deposition). Thereby, the stacked body 5A is formed.

For example, an interconnect pattern and/or holes (not shown) are provided in the stacked body 5A. For example, the film thicknesses in the stacking direction of the insulating films 3 and the sacrificial films 4 are about 50 nanometers.

Intermediate films 2A and 2B that are conductive films, insulating films, etc., are provided between the substrate 2 and the stacked body 5A and on the stacked body 5A. The intermediate films 2A and 2B each may be formed of multiple films. Or, the intermediate films 2A and 2B may not be formed.

As shown in FIG. 1B, a trench 5a is made by RIE (Reactive Ion Etching). The trench 5a pierces the stacked body 5A. The trench 5a may not pierce the stacked body 5A.

As shown in FIG. 1C, the sacrificial films 4 are removed via the trench 5a by performing isotropic etching such as CDE (Chemical Dry Etching), wet etching, etc. Subsequently, an insulating film 7 is formed on the entire surface. The insulating film 7 is, for example, a film including aluminum oxide. The insulating film 7 also enters cavities 4a after the removal of the sacrificial films 4 via the trench 5a.

As shown in FIG. 1D, a conductive film 6 is formed on the entire surface by CVD. The conductive film 6 is, for example, a tungsten (W) film. The conductive film 6 may be a film including polysilicon. In the case where the conductive film 6 is the tungsten film, the conductive film 6 can be formed by reducing tungsten hexafluoride ($WF_6$) with hydrogen (H). The conductive film 6 also enters the cavities 4a via the trench 5a. The conductive film 6 may be formed after forming a barrier metal of TiN, etc., on the entire surface.

As shown in FIG. 1E, after etching the conductive film 6, the conductive film 6 is formed selectively inside the cavities 4a; and etching is performed again. Thereby, a stacked body 5 is formed in which the insulating films 3 and the conductive films 6 are stacked alternately.

The process of FIG. 1E will now be described.

Initially, the conductive film 6 is etched by isotropic etching such as CDE, wet etching, etc., so that the mutually-adjacent conductive films 6 are not connected to each other. In the first etching, over-etching of the conductive films 6 is performed.

Accordingly, as shown in FIG. 2A, the exposed surfaces of the conductive films 6 recede into the cavities 4a from interfaces 4b. The interfaces 4b are, for example, surfaces provided in substantially the same plane as the insulating films 3 which are portions of the inner surface of the trench 5a. The interfaces 4b may be surfaces provided in substantially the same plane as the insulating film 7.

Then, in the case where the conductive films 6 are tungsten films, additional tungsten is selectively grown by CVD with using the conductive film 6 as its seed. For example, the tungsten is selectively grown by causing monosilane to adsorb to the tungsten films inside the cavities 4a by utilizing the reduction reaction between tungsten hexafluoride and monosilane ($SiH_4$). The tungsten inside the cavities 4a protrudes from the interfaces 4b because the tungsten on the insulating film 7 does not grow or because the film formation rate of the tungsten on the insulating film 7 is slower than the film formation rate on the tungsten films inside the cavities 4a.

Accordingly, as shown in FIG. 2B, the conductive films 6 that include first portions 6a and protruding portions 6b1 are formed. That is, films that include the same material as the conductive films 6 are formed on the conductive films 6.

Then, the conductive films 6 are caused to recede by etching the portion of the conductive films 6 (the protruding portions 6b1) protruding from the interfaces 4b by using CDE, RIE, wet etching, etc. By the second etching, the conductive films 6 are selectively etched; and the inner surface of the trench 5a can be flattened. For example, for CDE, the chemical reactions with the radicals of $BCl_3/Cl_2$ can be utilized. For RIE, the incident angle of ions can be substantially perpendicular to the interfaces 4b by utilizing the chemical reactions with the radicals of $BCl_3/Cl_2$, and, the conductive films 6 can be receded anisotropically. For wet etching, the conductive films 6 can be etched using hydrofluoric acid. The second etching may be performed by combining at least two of CDE, RIE, or wet etching.

The conductive films 6 are already separated in the stacking direction by the first etching. Thereby, the etching amount of the conductive films 6 by the second etching can be set to be less than the etching amount of the conductive films 6 by the first etching.

Accordingly, as shown in FIG. 2C, the conductive films 6 are formed inside the cavities 4a to planarize the inner surface of the trench 5a. The difference of the conductive film 6 width W1 in the upper layers and lower layers decreases. For example, the width W1 of the conductive film 6 is substantially the same for each layer. Note that the conductive films 6 include the first portions 6a and second portions 6b2. For example, there are cases where the conductive films 6 include boundaries 6c between the first portions 6a and the second portions 6b2.

Figure 1F:
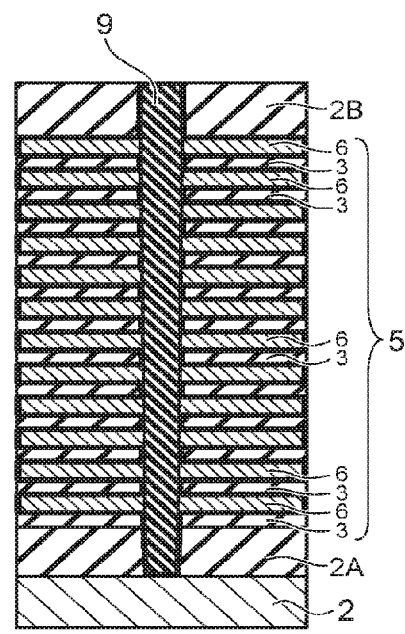

As shown in FIG. 1F, an insulating film 9 is formed inside the trench 5a. Thereby, the second portions 6b2 of the conductive films 6 contact the insulating film 9. For example, the second portions 6b2 of the conductive films 6 contact the insulating film 9 at the interfaces 4b.

By the interconnect formation method of the semiconductor device according to the embodiment, in a semiconductor device including stacked multiple interconnect layers, the conductor edges (e.g., the tungsten films) of the interconnect layers can be arranged in a same plane; and the width of the conductor can be set to be uniform between the interconnect layers. This method enables to suppress the discrepancies in the semiconductor device operations by decreasing the fluctuations of the interconnect conductor width between the upper layers and lower layers. For example, such an interconnect structure is applicable to a semiconductor memory device, etc.

Second Embodiment

FIG. 3A to FIG. 3D are cross-sectional views of processes, showing an interconnect formation method of a semiconductor device according to a second embodiment.

Figure 3A:
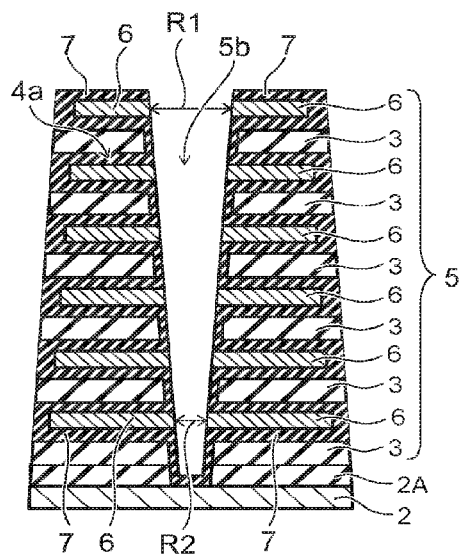
FIG. 3A to FIG. 3D are cross-sectional views of processes, showing an interconnect formation method of a semiconductor device according to a second embodiment.

As shown in FIG. 3A, the stacked body 5 that includes the insulating films 3 and the conductive films 6 is formed on the substrate 2.

The process of FIG. 3A will now be described.

Initially, the intermediate film 2A is formed on the substrate 2; and the stacked body 5A in which the insulating films 3 and the sacrificial films 4 are stacked alternately is formed on the intermediate film 2A. A trench 5b pierces the stacked body 5A; and the narrower width of the trench 5b decreases toward the substrate 2. A width R1 of the trench 5b is larger than a width R2 of the trench 5b.

Then, the cavities 4a are made by removing the sacrificial films 4 via the trench 5b; and the insulating film 7 is formed on the entire surface. Subsequently, the conductive film 6 is formed on the entire surface. The insulating film 7 and the conductive film 6 also enter the cavities 4a via the trench 5b. For example, the insulating films 3, the insulating film 7, and the conductive film 6 are formed by the processes shown in FIG. 1A to FIG. 1D of the first embodiment.

Then, the conductive film 6 is etched so that the mutually-adjacent conductive films 6 are not connected to each other. Thereby, the conductive films 6 are separated in the stacking direction. Because the width of the trench 5b decreases toward the substrate 2, the difference of the conductive films 6 width formed inside the cavities 4a is large between the upper layers and the lower layers. For example, the widths of the conductive films 6 increase toward the substrate 2.

Figure 3B:
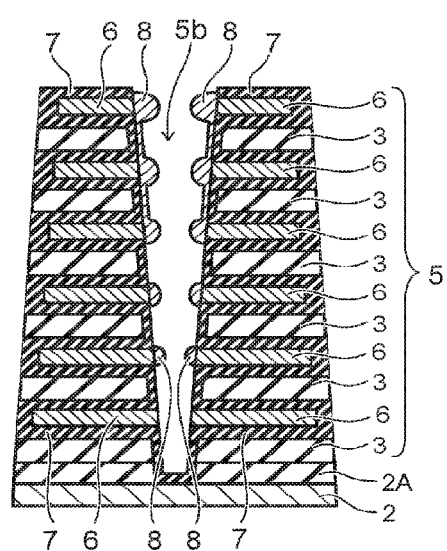

As shown in FIG. 3B, conductive films 8 are formed on the exposed surfaces of the conductive films 6. For example, the conductive films 8 are formed of the same material as the conductive films 6. The conductive films 8 are, for example, tungsten films. The conductive films 8 may be formed of a material that is different from that of the conductive films 6.

Also, the conductive films 8 can be formed by selecting conditions having a high loading effect. Thereby, the conductive films 8 formed on the exposed surfaces of the conductive films 6 of each layer are gradually thinner from the upper layers to the lower layers. This means that the conductive films 8 selectively grown on the exposed surfaces of the conductive films 6 are formed to be thick at the upper layers and thin at the lower layers. For example, the thicknesses of the conductive films 8 in a direction perpendicular to the stacking direction decrease gradually from the upper layers to the lower layers. The conductive films 8 are also formed on the insulating film 7.

Figure 3C:
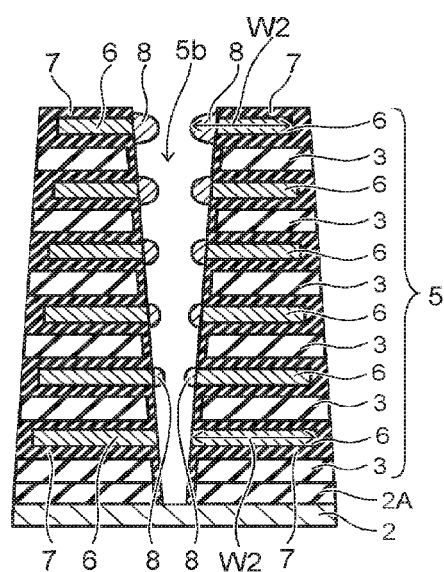

As shown in FIG. 3C, the conductive films 8 that are formed on the insulating film 7 are selectively etched so that the mutually-adjacent conductive films 8 are not connected to each other. Also, as described above, because the conductive films 8 are formed on the conductive films 6 to be thick at the upper layers and thin at the lower layers, the difference of the total width W2 which is the sum of widths of the conductive film 6 and the conductive film 8 is small between layers. For example, the total width W2 of the conductive film 6 and the conductive film 8 becomes substantially the same for each layer. In the case where the conductive films 6 and the conductive films 8 are formed of the same films such as tungsten films or the like, the conductive films 6 are the first portions of the tungsten films; and the conductive films 8 are the second portions of the tungsten films.

Figure 3D:
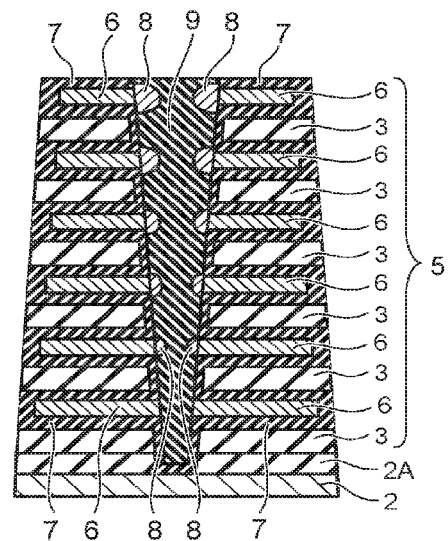

As shown in FIG. 3D, the insulating film 9 is formed inside the trench 5b. The conductive films 8 are positioned inside the insulating film 9.

By the interconnect formation method of the semiconductor device according to the embodiment, in a semiconductor device including stacked multiple interconnect layers, the widths of the conductors (e.g., the tungsten films) of the interconnect layers can be set to be uniform. Because, in this situation, the resistance fluctuation of conductors between layers is small, hence the occurrence of discrepancies in the operations of the semiconductor device is suppressed. For example, such an interconnect structure is applicable to a semiconductor memory device, etc.

Third Embodiment

Figure 4:
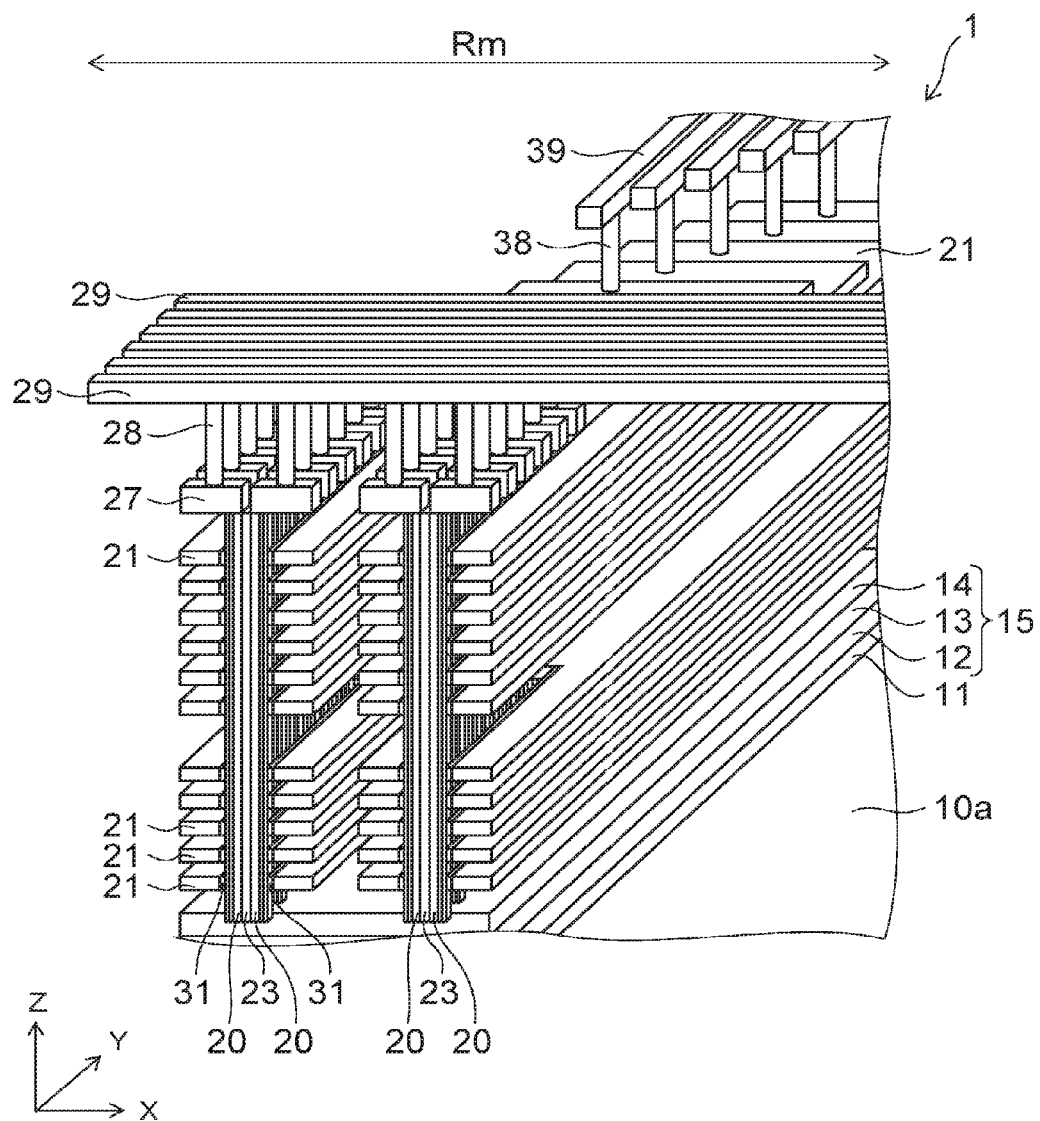
FIG. 4 is a schematic perspective view showing a semiconductor device according to a third embodiment.

FIG. 4 is a schematic perspective view showing a semiconductor device according to the third embodiment.

Figure 5:
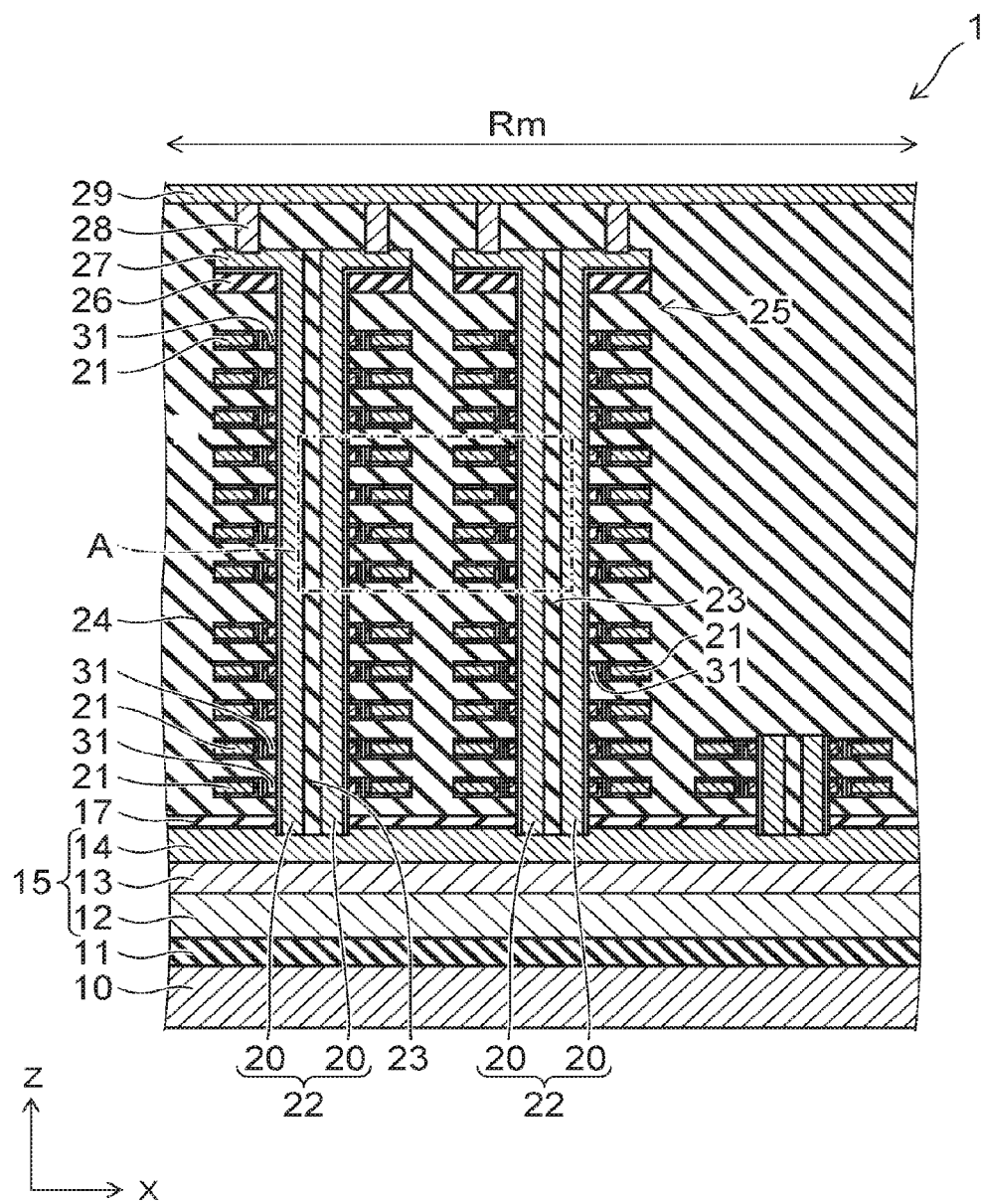
FIG. 5 is a schematic cross-sectional view showing the semiconductor device according to the third embodiment.

FIG. 5 is a schematic cross-sectional view showing the semiconductor device according to the third embodiment.

Figure 6:
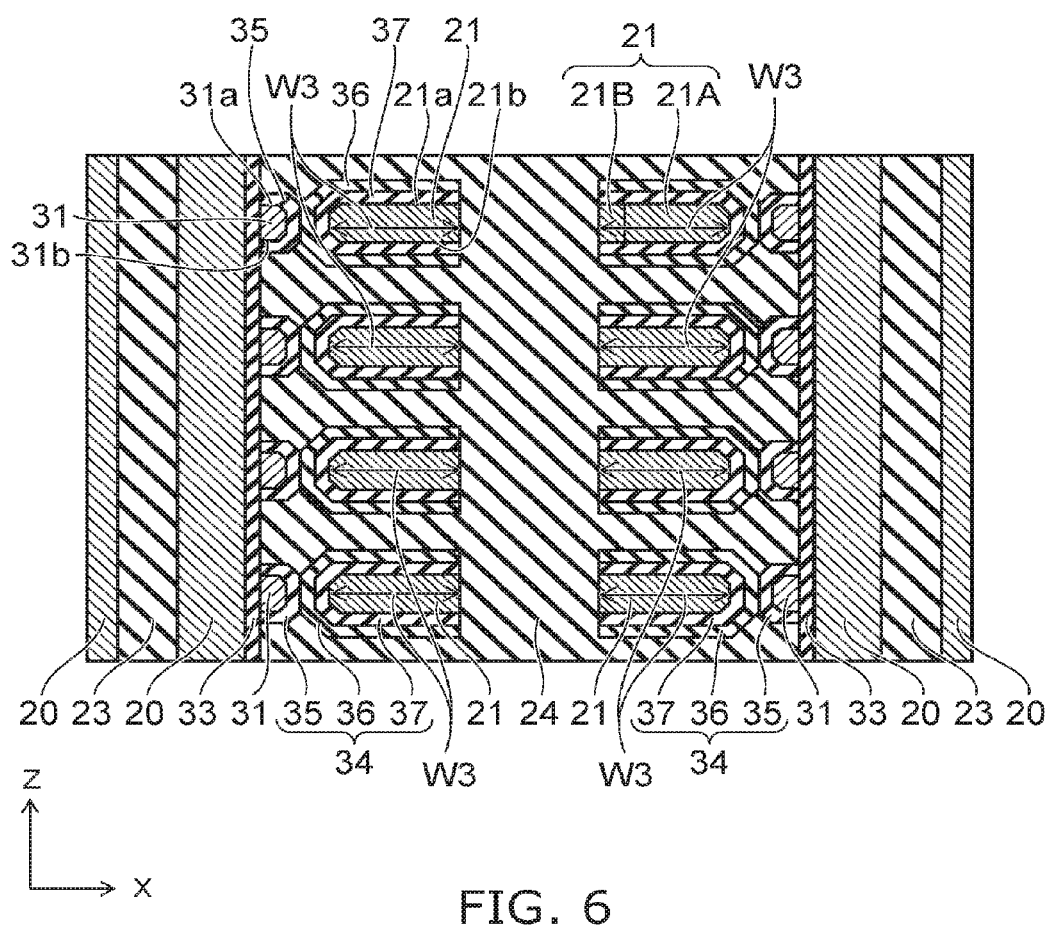
FIG. 6 is a cross-sectional view showing region A shown in FIG. 5.

FIG. 6 is a cross-sectional view showing region A shown in FIG. 5.

The semiconductor device of the embodiment is a semiconductor memory device having a three-dimensional structure.

As shown in FIG. 4 and FIG. 5, a substrate 10 is used in the semiconductor device 1. The substrate 10 is, for example, a silicon substrate. A memory cell region Rm is allocated on the substrate 10. Also, a region that includes a peripheral circuit of transistors, etc., is allocated on the substrate 10 and is positioned outside the memory cell region Rm.

Hereinbelow, an XYZ orthogonal coordinate system is employed for convenience of description in the specification. Two mutually-orthogonal directions parallel to an upper surface 10a of the substrate 10 are taken as an "X-direction" and a "Y-direction;" and a direction perpendicular to the upper surface 10a is taken as a "Z-direction."

In the memory cell region Rm, an insulating layer 11 that is made of, for example, silicon oxide, a conductive layer 12 that is made of, for example, polysilicon, an interconnect layer 13 that is made of, for example, tungsten, and a conductive layer 14 that is made of, for example, polysilicon are stacked in this order on the substrate 10. A cell source line 15 is formed of the conductive layer 12, the interconnect layer 13, and the conductive layer 14.

An insulating film 17 made of, for example, silicon oxide is provided on the cell source line 15. Multiple silicon pillars 20 (semiconductor pillars) that extend in the Z-direction are provided on the cell source line 15. The silicon pillars 20 are made of, for example, polysilicon; and the lower ends of the silicon pillars 20 pierce the insulating film 17 and are connected to the cell source line 15. When viewed from the Z-direction, the silicon pillars 20 are arranged in a matrix configuration along the X-direction and the Y-direction and have a common connection with a single cell source line 15.

Multiple control gate electrode films 21 are provided at the sides of the silicon pillars 20 and are separated from each other along the Z-direction. Each of the control gate electrode films 21 is made of, for example, tungsten and extends in the Y-direction. In the X-direction, two silicon pillars 20 and two control gate electrode films 21 are arranged alternately. In other words, when the silicon pillars 20 arranged along the X-direction are organized into multiple sets 22 every two mutually-adjacent silicon pillars 20, and two control gate electrode films 21 are arranged to be positioned between the sets 22, the control gate electrode films 21 are not arranged between the two silicon pillars 20 of each set 22.

An inter-layer insulating film 23 is provided between the silicon pillars 20. Also, inter-layer insulating films 24 made of, for example, silicon oxide are provided between the control gate electrode films 21, below the control gate electrode film 21 of the lowermost layer, and above the control gate electrode film 21 of the uppermost layer. A hard mask 26 is provided on a stacked body 25 that is made of the multiple control gate electrode films 21, the inter-layer insulating films 23, and the inter-layer insulating films 24.

The silicon pillars 20 which are drawn out above the hard mask 26 and are formed as one body with interconnects 27 extending in the X-direction. Vias 28 are provided on the interconnects 27; and bit lines 29 that extend in the X-direction are provided on the vias 28. The bit lines 29 are connected to the interconnects 27 by the vias 28. Thus, each silicon pillar 20 forms a part of the connection between the bit line 29 and the cell source line 15. In other words, the semiconductor device 1 is an I-shaped pillar type nonvolatile memory device.

The Y-direction end portion of the stacked body 25 is patterned into a stairstep configuration; and the multiple control gate electrode films 21 that have the same position in the Z-direction are unified as one at the end portion. A via 38 is provided on the end portion of each unified control gate electrode film 21. A word line 39 that extends in the Y-direction is provided on the via 38. The position of the word lines 39 in the Z-direction is the same as the position of the bit lines 29. The word line 39 is connected to the control gate electrode film 21 by the via 38.

As shown in FIG. 6, floating gate electrode films 31 that are made of, for example, polysilicon are provided between the silicon pillars 20 and the control gate electrode films 21. Because the floating gate electrode films 31 are provided at each intersection between the silicon pillars 20 and the control gate electrode films 21, the floating gate electrode films 31 are arranged in a matrix configuration separated from each other along the Y-direction and the Z-direction. As described above, the floating gate electrode films 31 are arranged also along the X-direction because the silicon pillars 20 and the control gate electrode films 21 are arranged along the X-direction. As a result, the floating gate electrode films 31 are arranged in an XYZ three-dimensional matrix configuration.

A tunneling insulating film 33 that is made of, for example, silicon oxide is provided between the silicon pillar 20 and the floating gate electrode films 31. The tunneling insulating film 33 is provided for each silicon pillar 20; and the configuration of the tunneling insulating film 33 is a band configuration having the X-direction as the thickness direction, having the Y-direction as the width direction, and extending in the Z-direction.

A blocking insulating film 34 is provided between the floating gate electrode film 31 and the control gate electrode film 21. The blocking insulating film 34 is, for example, a three-layer film in which a silicon nitride layer 35, a silicon oxide layer 36, and a silicon nitride layer 37 are stacked in this order from the floating gate electrode film 31 side toward the control gate electrode film 21 side. The silicon nitride layer 35 is formed around the floating gate electrode film 31 and covers an upper surface 31a and a lower surface 31b of the floating gate electrode film 31. Also, the silicon oxide layer 36 and the silicon nitride layer 37 are formed around the control gate electrode film 21 and cover an upper surface 21a and a lower surface 21b of the control gate electrode film 21.

Although the tunneling insulating film 33 normally is insulative, the tunneling insulating film 33 is a film in which a tunneling current flows when a voltage within the range of the drive voltage of the semiconductor device 1 is applied. The blocking insulating film 34 is a film in which a current substantially does not flow even when a voltage within the range of the drive voltage of the semiconductor device 1 is applied.

As described above, the multiple control gate electrode films 21 extend in the Y-direction to be separated from each other along the Z-direction. Also, as shown in FIG. 6, the control gate electrode films 21 include first portions 21A and second portions 21B so that the difference becomes small between widths W3 in the X-direction of the control gate electrode films 21. That is, the control gate electrode films 21 are provided in the set 22 so that the widths W3 in the X-direction of the control gate electrode films 21 become uniform. For example, the control gate electrode films 21 are provided in the set 22 so that the widths W3 in the X-direction of the control gate electrode films 21 are substantially equal regardless of the position in the Z-direction (the stacking direction). For example, the surface of the second portion 21B contacting the inter-layer insulating film 24 and the surface of the blocking insulating film 34 contacting the inter-layer insulating film 24 are positioned in substantially the same plane.

By thus arranging the control gate electrode films 21, the regions where the word lines 39 are formed can be set to be uniform in the Z-direction. That is, the fluctuation of the surface area between the multiple control gate electrode films 21 provided in the Z-direction can be reduced by making uniform the widths W3 in the X-direction of the control gate electrode films 21. By making uniform the regions where the word lines 39 are formed (the widths of the control gate electrode films 21), the resistance fluctuation of the word lines 39 in the Z-direction is suppressed; and the difference of the programming speed in the Z-direction can be reduced. For example, the difference of the programming speed between the memory cells which lie on the upper layers and the memory cells which lie on the lower layers can be reduced. Thereby, the occurrence of discrepancies of the memory operations is suppressed. Also, in the case where the area fluctuation of the control electrode films 21 in the Z-direction is reduced, there are less needs for adjustments of the memory cell region Rm taking into account of the area fluctuation of the control gate electrode films 21.

A method for manufacturing the semiconductor device will now be described.

FIG. 7A to FIG. 7K are cross-sectional views of processes, showing the method for manufacturing the semiconductor device according to the third embodiment.

Figure 7A:
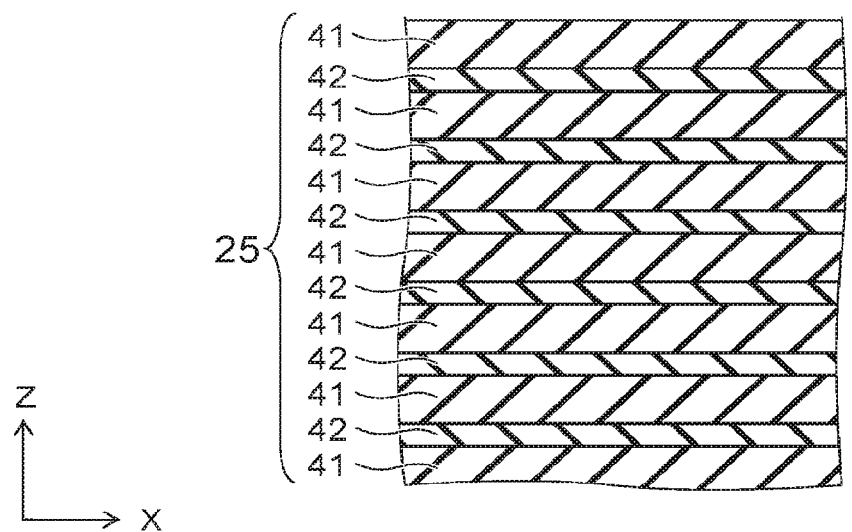
FIG. 7A to FIG. 7K are cross-sectional views of processes, showing the method for manufacturing the semiconductor device according to the third embodiment.
Figure 7B:
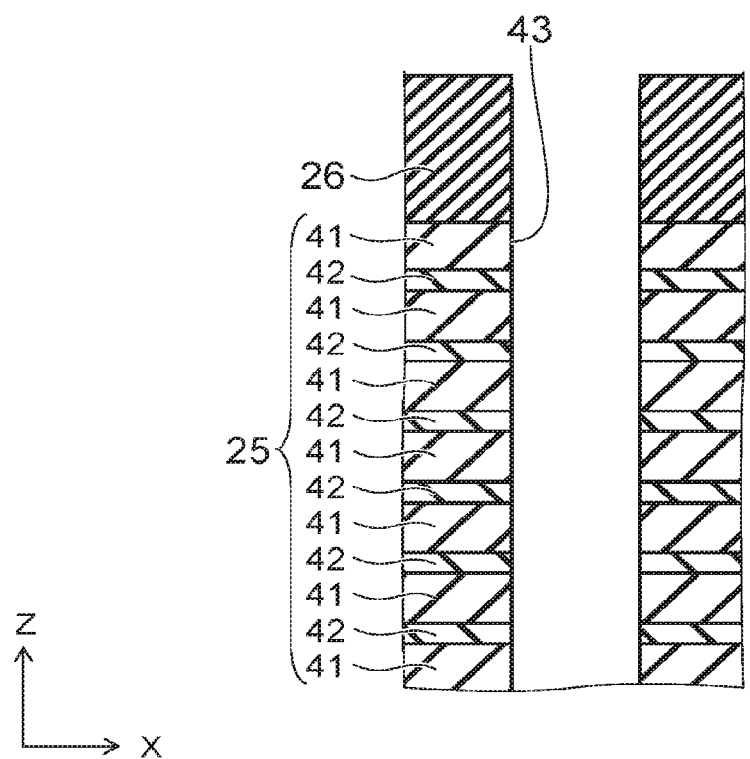
Figure 7C:
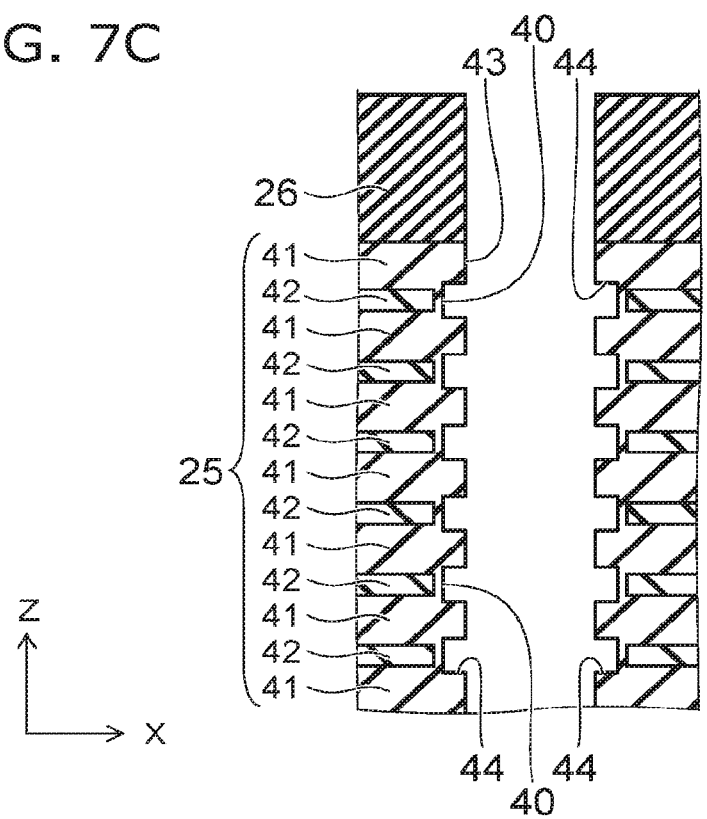
Figure 7D:
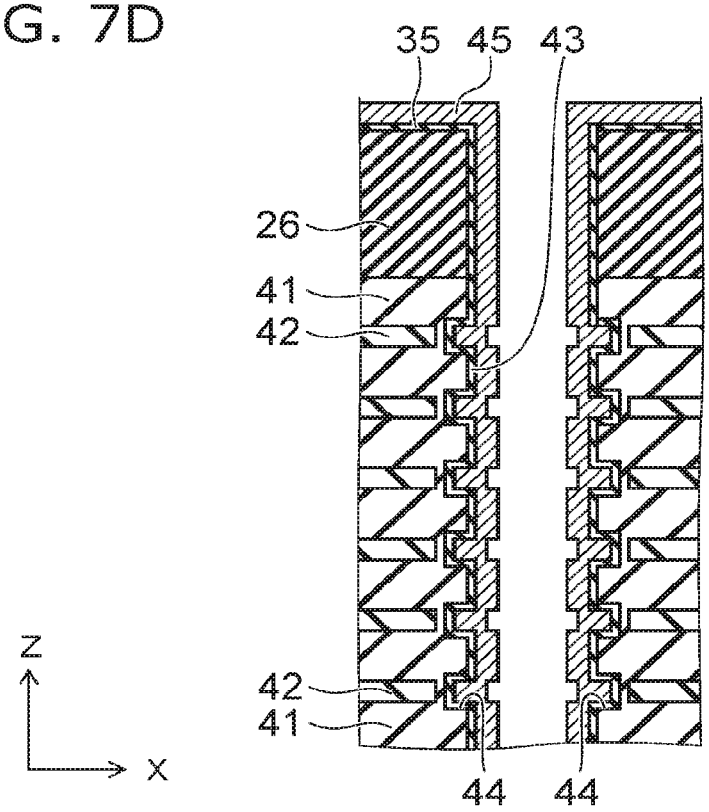
Figure 7E:
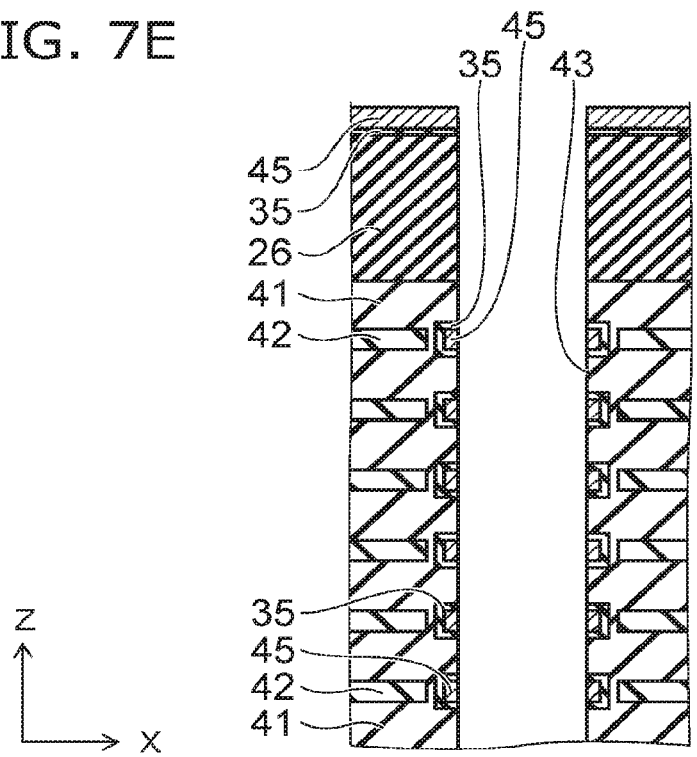
Figure 7F:
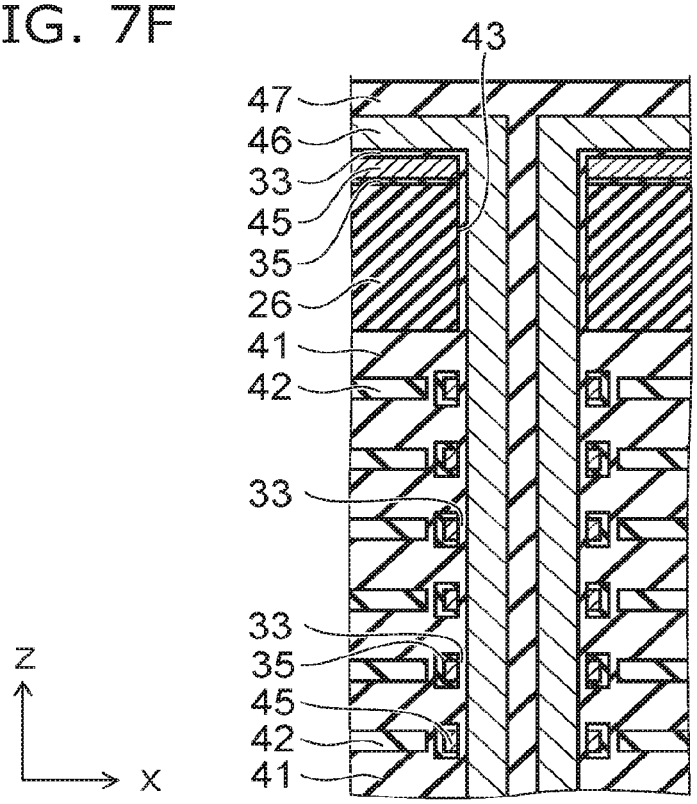
Figure 7G:
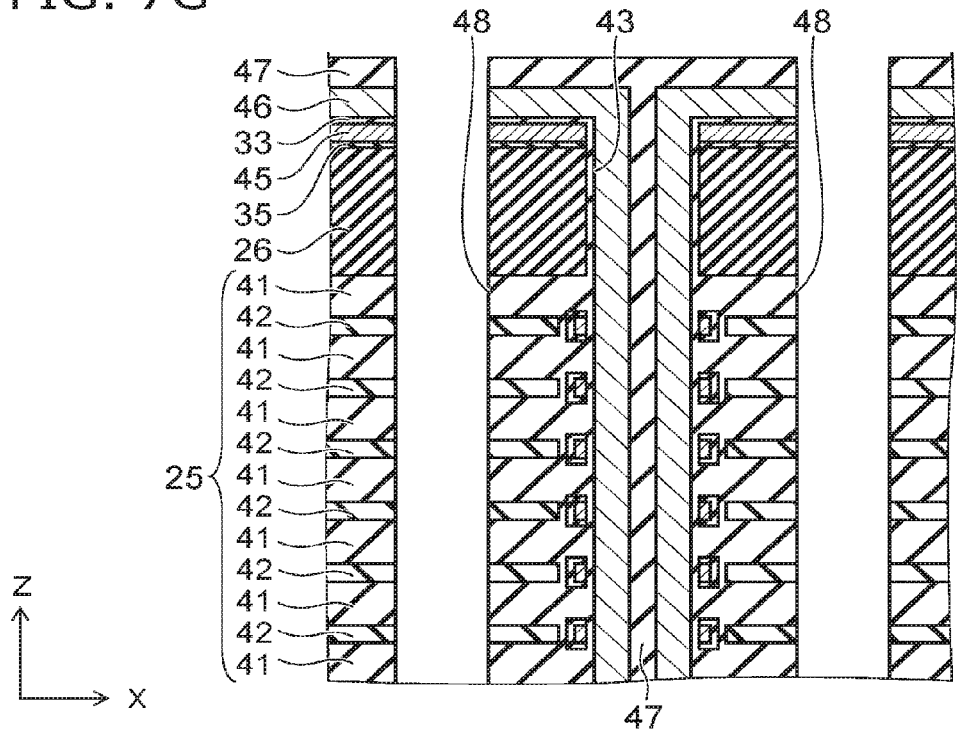
Figure 7H:
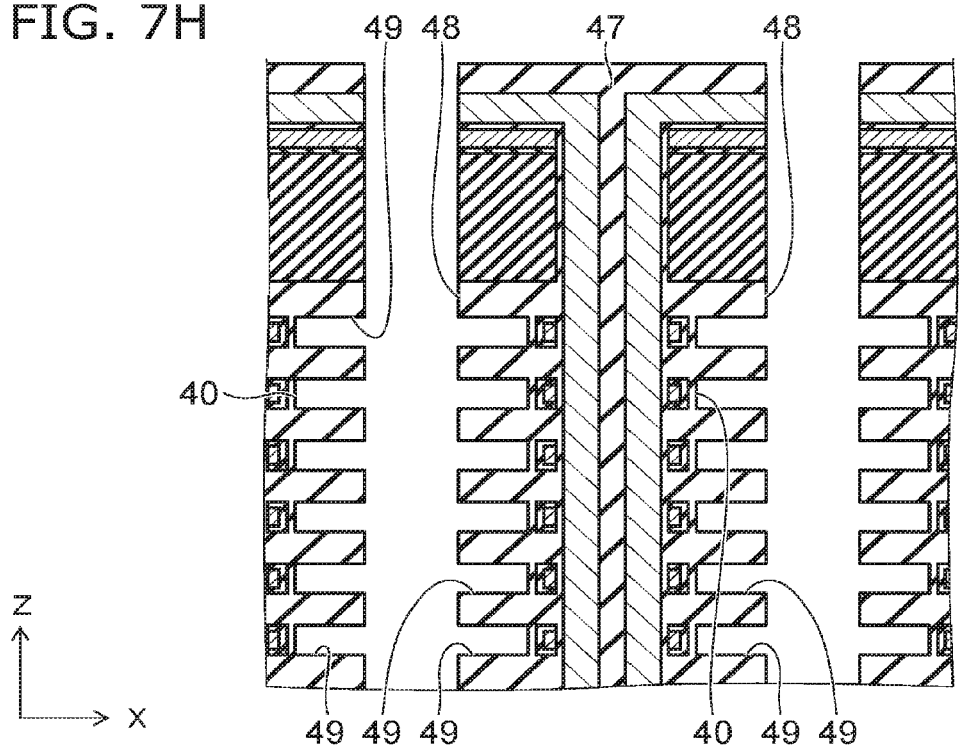
Figure 7I:
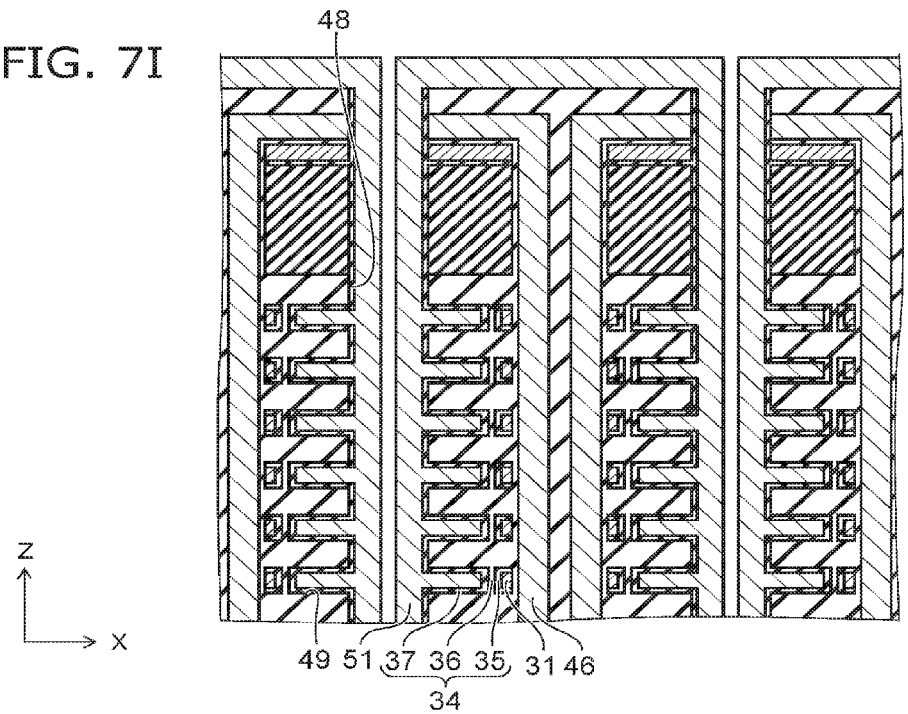
Figure 7J:
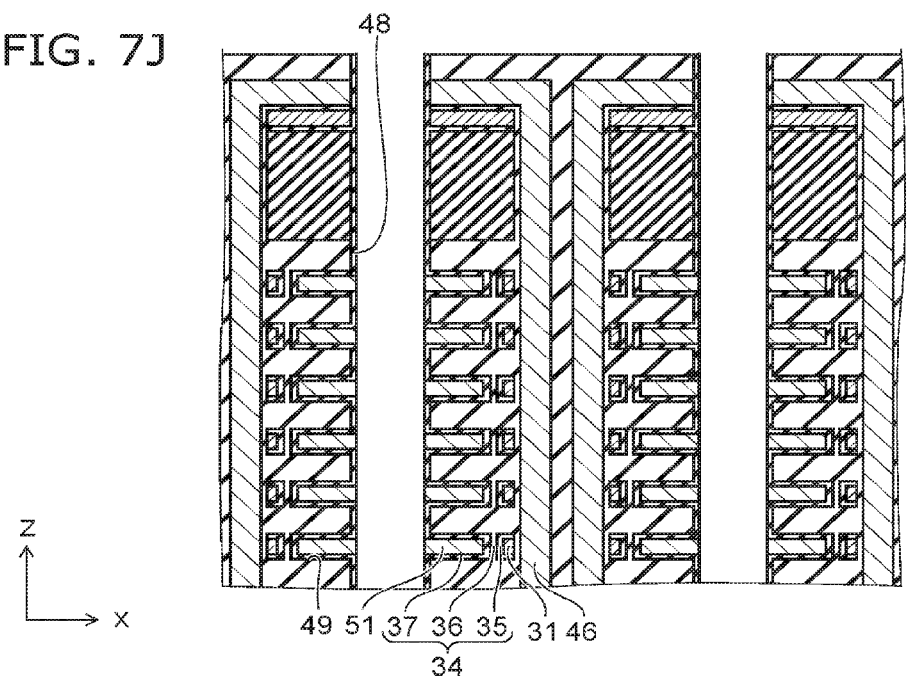
Figure 8A:
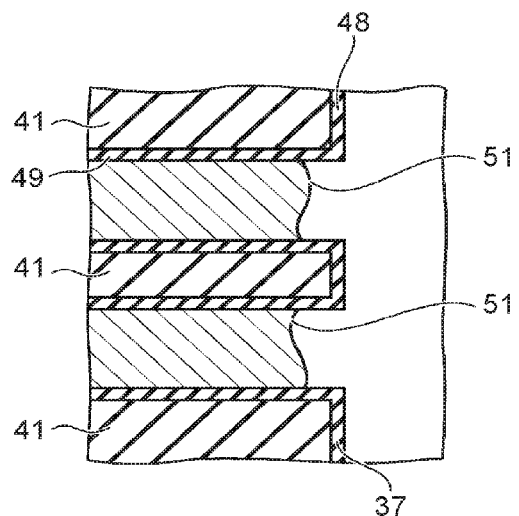
FIG. 8A to FIG. 8C are enlarged cross-sectional views showing the film formation process of FIG. 7J.
Figure 8B:
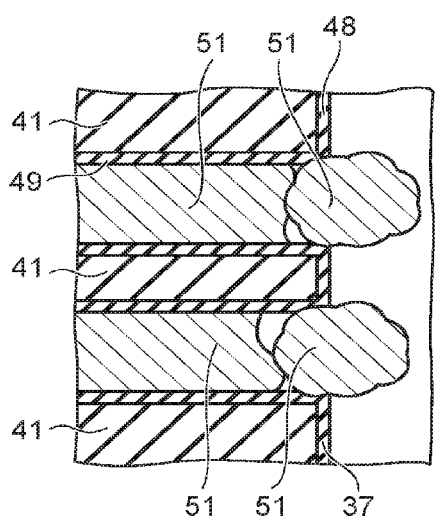
Figure 8C:
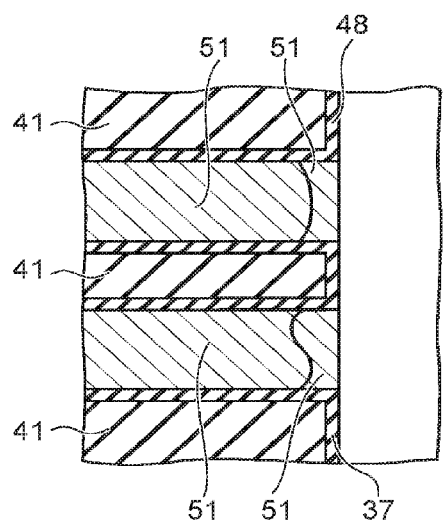

FIG. 8A to FIG. 8C are enlarged cross-sectional views showing the film formation process of FIG. 7J.

FIG. 7A to FIG. 7K show the memory cell region Rm.

Initially, polysilicon layers and silicon oxide films are formed on the substrate 10. Then, these layers are patterned by RIE. Thereby, in the memory cell region Rm, the insulating layer 11, the conductive layer 12, the interconnect layer 13, the conductive layer 14, and the insulating film 17 are formed for each block. The cell source line 15 is formed of the stacked body that is made of the conductive layer 12, the interconnect layer 13, and the conductive layer 14.

Then, as shown in FIG. 7A, silicon oxide films 41 and silicon nitride films 42 are stacked alternately on the insulating film 17. For example, any number of stacks of the silicon oxide films 41 and the silicon nitride films 42 are stacked by CVD. Thereby, the stacked body 25 is formed.

Then, as shown in FIG. 7B, the hard mask 26 that is made of, for example, silicon nitride is formed on the stacked body 25. Then, the hard mask 26 is patterned; and anisotropic etching such as RIE, etc., of the stacked body 25 is performed using the patterned hard mask 26 as a mask. Thereby, multiple trenches 43 that extend in the Y-direction are made in the stacked body 25. The trenches 43 pierce the stacked body 25.

Then, as shown in FIG. 7C, the silicon nitride films 42 are etched via the trenches 43 by wet etching. Thereby, the exposed surfaces of the silicon nitride films 42 at the inner surfaces of the trenches 43 recede; and recesses 44 that extend in the Y-direction are made. Then, oxidation treatment is performed by SPA, etc. Thereby, the exposed surfaces of the silicon nitride films 42 at the inner surfaces of the trenches 43 are covered with a thin silicon oxide layer 40.

Then, as shown in FIG. 7D, the silicon nitride layer 35 is formed on the entire surface. Then, a polysilicon film 45 is formed on the entire surface. The silicon nitride layer 35 and the polysilicon film 45 are formed also on the inner surfaces of the trenches 43 and enter the recesses 44.

Then, as shown in FIG. 7E, the polysilicon film 45 and the silicon nitride layer 35 are selectively removed along the trenches 43 so that the polysilicon films 45 and the silicon nitride layers 35 remain inside the recesses 44, and the polysilicon films 45 that remain inside the recesses 44 adjacent to each other in the Z-direction are separated from each other. Similarly, the silicon nitride layers 35 that remain inside the recesses 44 adjacent to each other in the Z-direction are separated from each other.

When separating the polysilicon films 45 that remain inside the recesses 44 adjacent to each other in the Z-direction from each other, etching of the polysilicon films 45 can be performed;

and subsequently, the polysilicon films 45 can be formed selectively inside the recesses 44 and etching can be performed again.

In such a case, the polysilicon films 45 are etched by isotropic etching such as CDE, wet etching, etc. In the case of the first etching, over-etching of the polysilicon films 45 is performed. Then, the polysilicon films 45 are selectively grown by CVD, etc.; and the polysilicon films 45 are caused to protrude from the recesses 44. Subsequently, the polysilicon films 45 are caused to recede by etching the portions of the polysilicon films 45 protruding from the recesses 44 using CDE, RIE, wet etching, etc. By the second etching, the polysilicon films 45 are etched selectively; and the inner surfaces of the trenches 43 can be flattened.

Then, as shown in FIG. 7F, the tunneling insulating film 33, a polysilicon film 46, and an insulating film 47 are deposited in this order.

Then, as shown in FIG. 7G, trenches 48 that extend in the Y-direction are made between the trenches 43 in the stacked body 25 and in the stacked body stacked above the stacked body 25. Thereby, the trenches 43 and the trenches 48 are arranged alternately along the X-direction.

Then, as shown in FIG. 7H, the silicon nitride films 42 are etched via the trenches 48 by wet etching. Thereby, the silicon nitride films 42 are removed; and recesses 49 that extend in the Y-direction are made at the inner surfaces of the trenches 48.

Then, as shown in FIG. 7I, the silicon oxide layer 40 that is exposed at the back surfaces of the recesses 49 is removed. Thereby, the silicon nitride layers 35 are exposed at the back surfaces of the recesses 49. Then, the silicon oxide layer 36 and the silicon nitride layer 37 are formed on the inner surfaces of the trenches 48. As a result, the blocking insulating film 34 is formed of the silicon nitride layers 35, the silicon oxide layer 36, and the silicon nitride layer 37. Then, a tungsten film 51 is formed on the entire surface by, for example, CVD. The silicon oxide layer 36, the silicon nitride layer 37, and the tungsten film 51 also enter the recesses 49 via the trenches 48.

Then, as shown in FIG. 7J, the tungsten film 51 is selectively removed along the trenches 48. Thereby, the tungsten films 51 are caused to remain inside the recesses 49; and the tungsten films 51 that remain inside the recesses 49 adjacent to each other in the Z-direction are separated from each other. As a result, the control gate electrode films 21 that are made of the tungsten films 51 are formed inside the recesses 49.

When separating the tungsten films 51 that remain inside the recesses 49 adjacent to each other in the Z-direction, after etching the tungsten films 51, subsequently, additional tungsten films 51 can be formed selectively inside the recesses 49 and be recessed again to separate from the adjacent tungsten films 51.

In such a case as shown in FIG. 8A, the tungsten films 51 are etched by isotropic etching such as CDE, wet etching, etc. In the case of the first etching, over-etching of the tungsten films 51 is performed. Then, as shown in FIG. 8B, the tungsten films 51 are selectively grown by CVD, etc.; and the tungsten films 51 are caused to protrude from the recesses 49. Subsequently, as shown in FIG. 8C, the tungsten films 51 are receded by etching the portions of the tungsten films 51 protruding from the recesses by means of CDE, RIE, wet etching, etc. By the second etching, the tungsten films 51 are etched selectively; and the inner surfaces of the trenches 48 can be flattened.

Figure 7K:
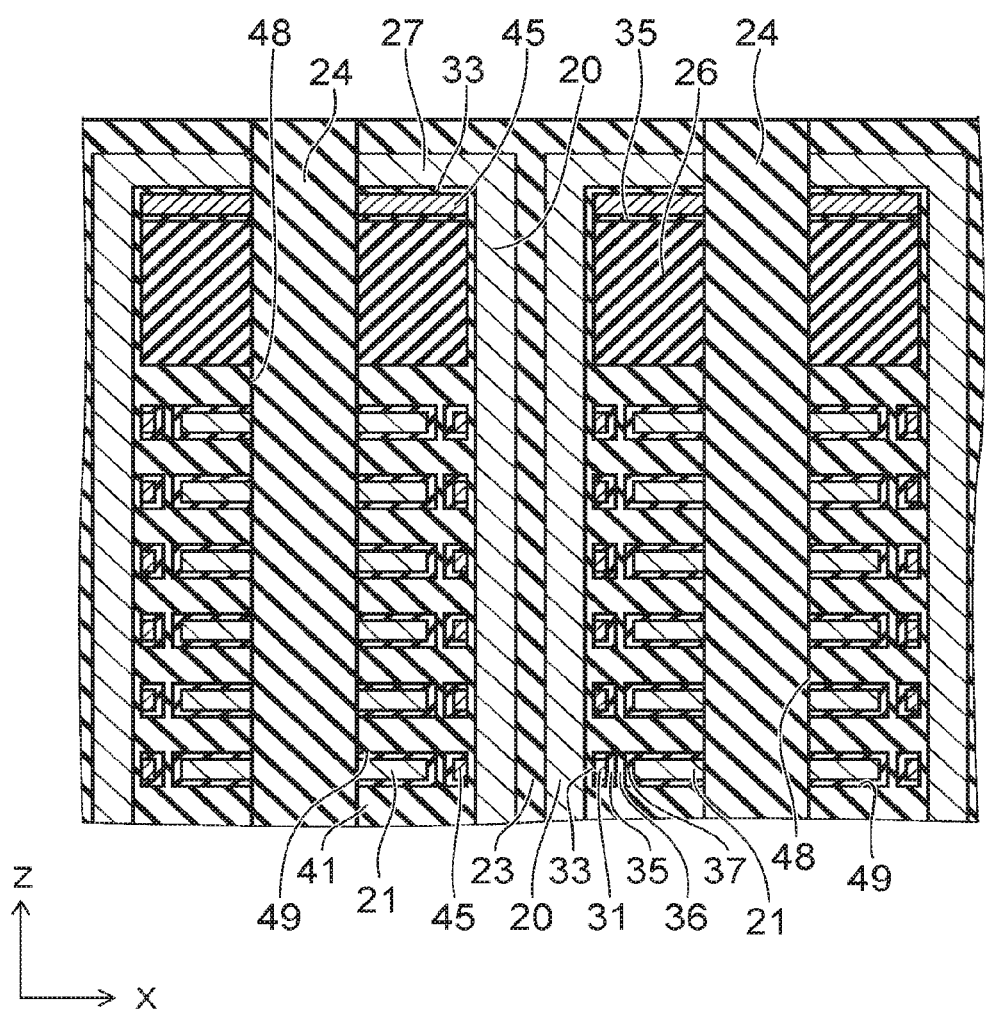

Then, as shown in FIG. 7K, the inter-layer insulating film 24 is filled into the trenches 48; and the upper surface is planarized. Subsequently, the inter-layer insulating film 23 is deposited on the entire surface. Also, the silicon oxide films 41 and the inter-layer insulating film 24 are used to form a portion of the inter-layer insulating film 23.

The vias 28, the vias 38, the bit lines 29, and the word lines 39 are formed; and the semiconductor device 1 is manufactured.

The interconnect formation method of the first embodiment is used in the method for manufacturing the semiconductor device 1 described above. That is, as shown in FIGS. 7E and 73, by the interconnect formation method of the first embodiment, the polysilicon films 45 are separated from each other; and the tungsten films 51 are separated from each other.

Another method for manufacturing the semiconductor device will now be described.

FIG. 9A to FIG. 9D are cross-sectional views of processes, showing the other method for manufacturing the semiconductor device according to the third embodiment.

Figure 9A:
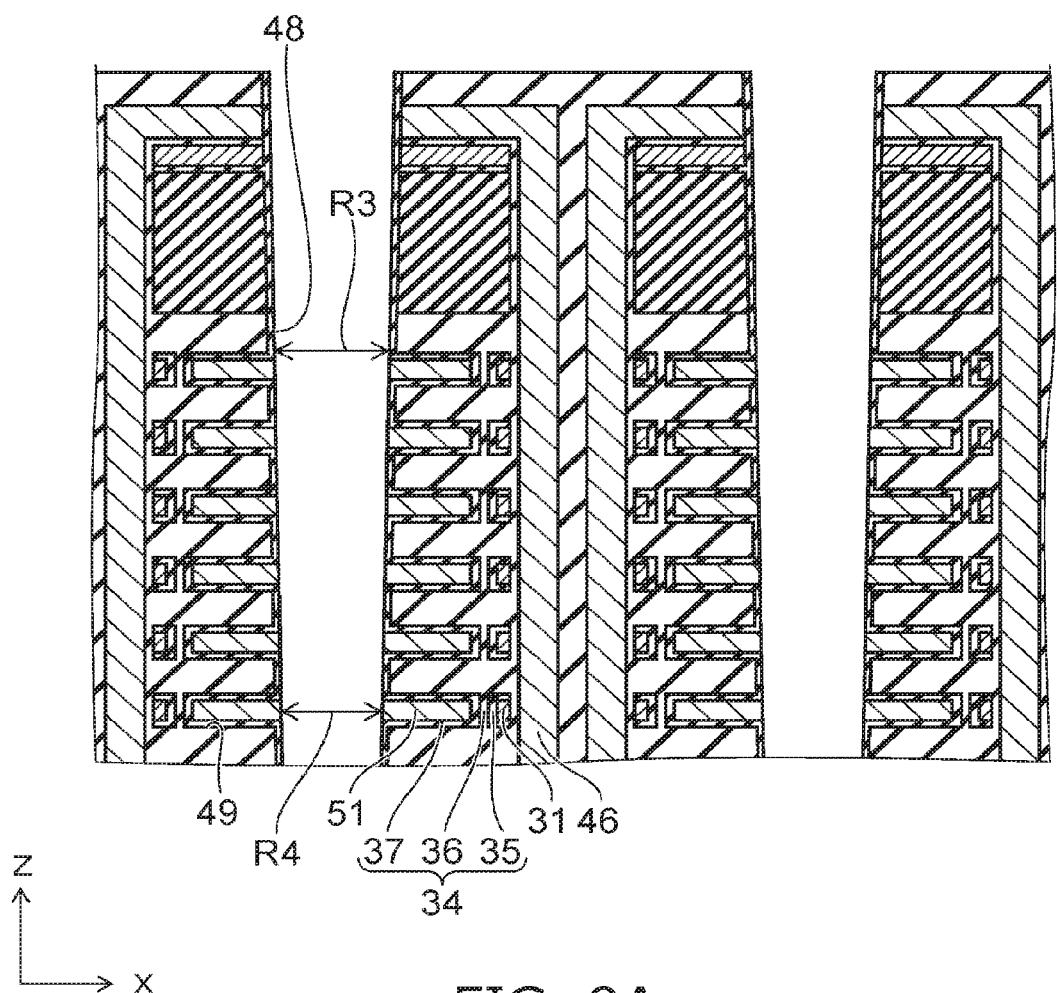
FIG. 9A to FIG. 9D are cross-sectional views of processes, showing the other method for manufacturing the semiconductor device according to the third embodiment.

The cross-sectional view of the process of FIG. 9A corresponds to the cross-sectional view of the process of FIG. 7J.

The processes prior to the process shown in FIG. 9A are the same as the processes described in reference to FIG. 7A to FIG. 7I. Thereby, a detailed description of these processes and drawings corresponding to these processes are omitted.

As shown in FIG. 9A, the width of the trench 48 decreases gradually from the upper layers to the lower layers. A width R3 of the trench 48 is larger than a width R4 of the trench 48. The tungsten films 51 are selectively removed along the trench 48. Thereby, the tungsten films 51 are remained inside the recesses 49; and the tungsten films 51 which remain inside the recesses 49 are separated from adjacent tungsten films 51.

Figure 9B:
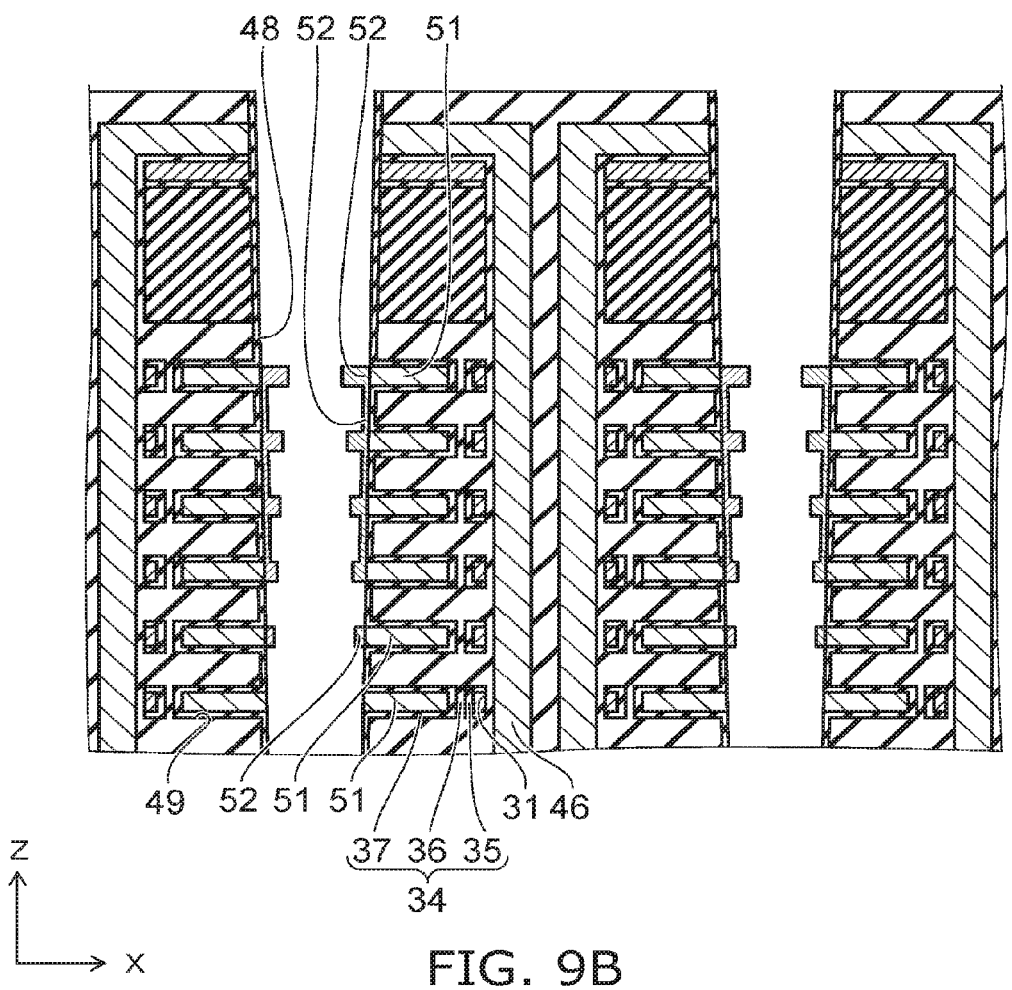

Then, as shown in FIG. 9B, a tungsten film 52 is formed on the exposed surfaces of the tungsten films 51. The tungsten film 52 is formed by selecting conditions having a high loading effect. Thereby, the thicknesses of the tungsten films 52 formed on the exposed surfaces of the tungsten films 51 of each layer decrease gradually from the upper layers to the lower layers. This means that the tungsten films 52 selectively grown on the exposed surfaces of the tungsten films 51 are formed to be thick at the upper layers and thin at the lower layers. The tungsten film 52 is formed also on the silicon nitride layer 37.

Figure 9C:
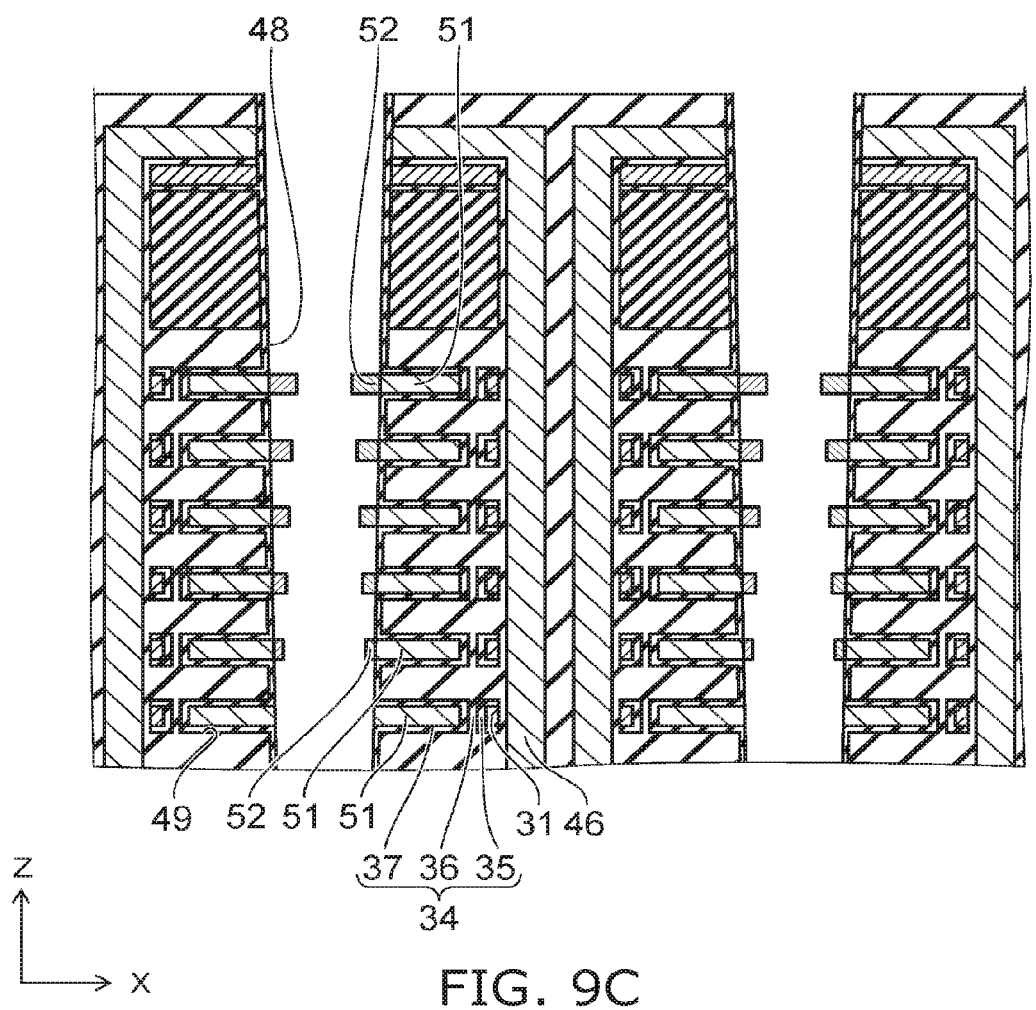

Then, as shown in FIG. 9C, the tungsten film 52 that is formed on the silicon nitride layer 37 is selectively etched. As a result, the control gate electrode films 21 that are made of the tungsten films 52 and the tungsten films 51 inside the recesses 49 are formed. The difference of the total width of the tungsten film 51 and the tungsten film 52 between the upper layers and the lower layers is small. For example, the total width of the tungsten film 51 and the tungsten film 52 is substantially the same for each layer. The tungsten films 51 are the first portions 21A of the control gate electrode films 21; and the tungsten films 52 are the second portions 21B of the control gate electrode films 21.

Figure 9D:
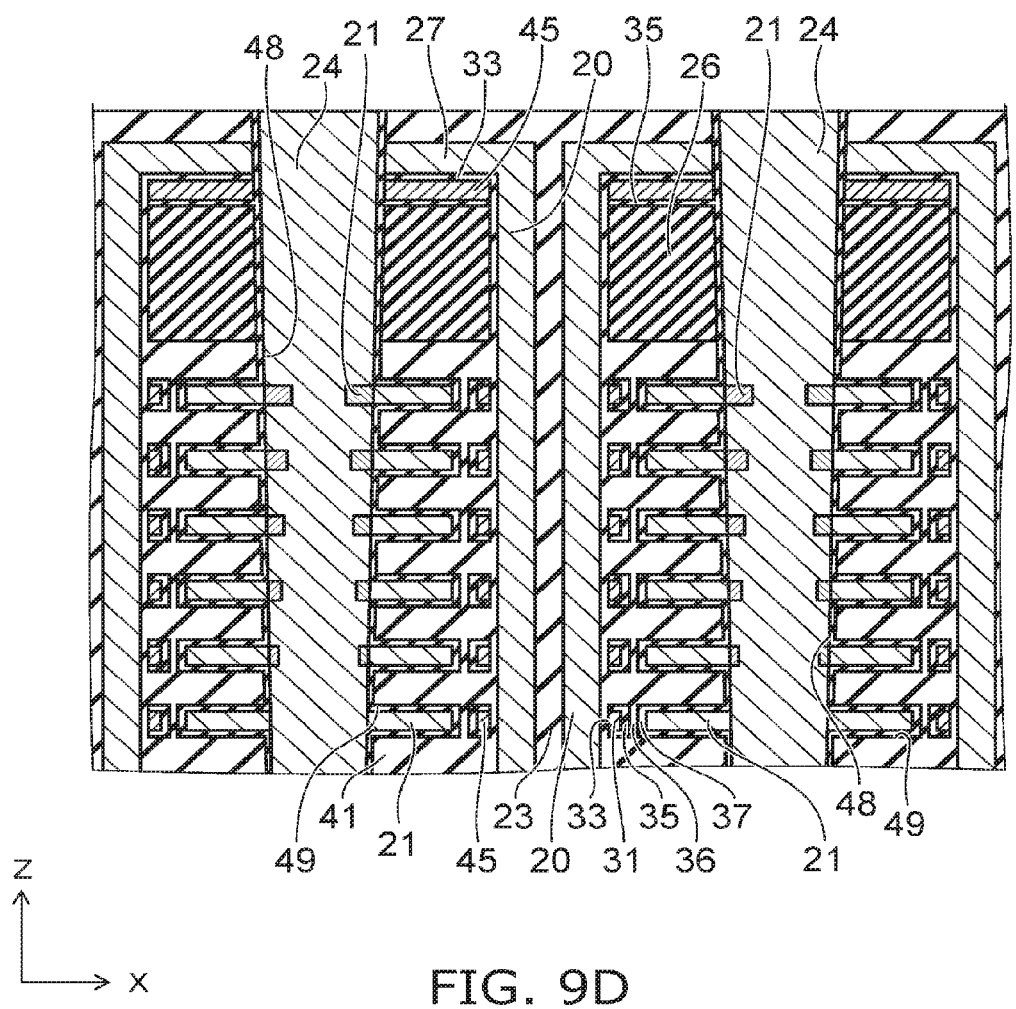

Then, as shown in FIG. 9D, the inter-layer insulating film 24 is filled into the trenches 48; and the upper surface is planarized. Subsequently, the inter-layer insulating film 23 is deposited on the entire surface. The second portions 21B are positioned inside the inter-layer insulating film 24.

The vias 28, the vias 38, the bit lines 29, and the word lines 39 are formed; and the semiconductor device 1 is manufactured.

The interconnect formation method of the second embodiment is used in the method for manufacturing the semiconductor device 1 described above. That is, as shown in FIG. 9B and FIG. 9C, the stacked films that include the tungsten films 51 and the tungsten films 52 are separated layer by layer by the interconnect formation method of the second embodiment.

An example of another semiconductor device will now be described.

Fourth Embodiment

Figure 10:
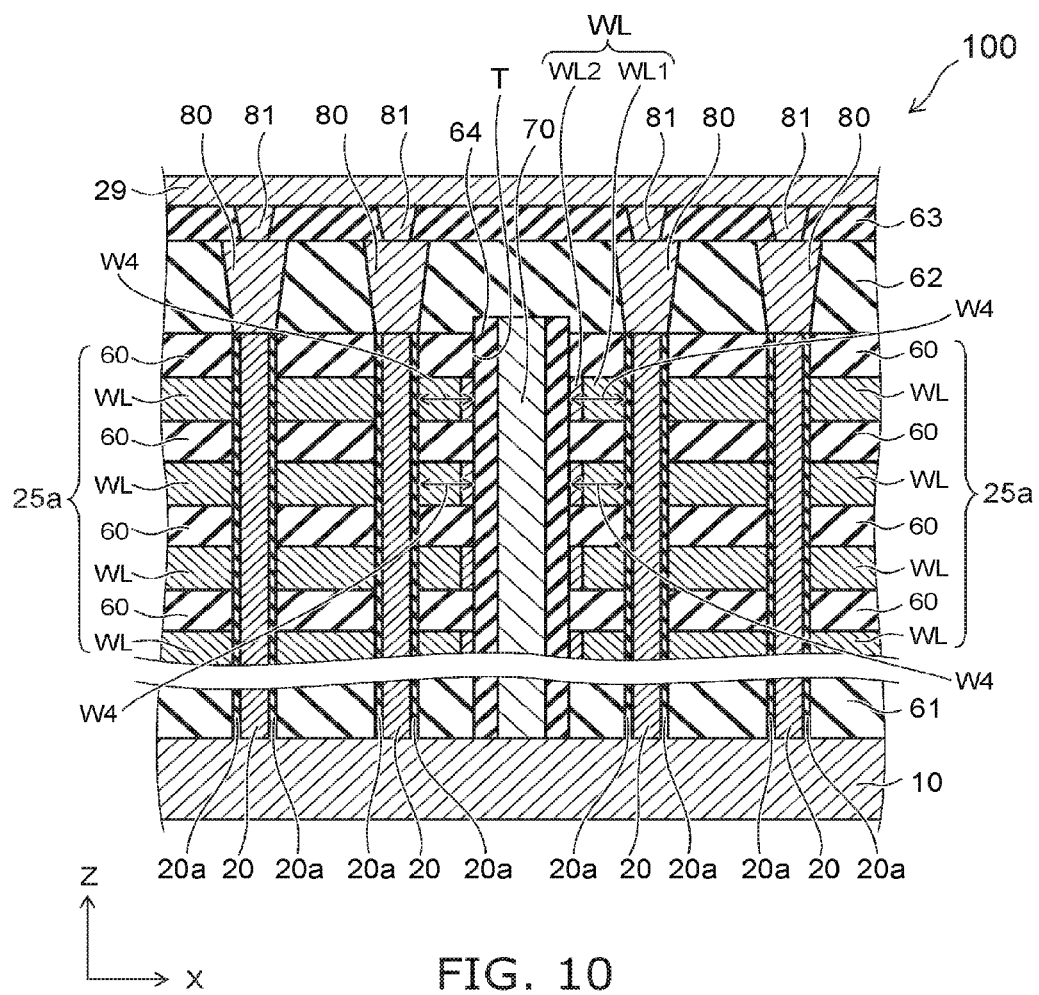
FIG. 10 is a schematic cross-sectional view showing a semiconductor device according to a fourth embodiment.

FIG. 10 is a schematic cross-sectional view showing a semiconductor device according to a fourth embodiment.

The semiconductor device of the embodiment is a semiconductor memory device having a three-dimensional structure.

As shown in FIG. 10, the semiconductor device 100 includes the substrate 10, a stacked body 25a, the multiple silicon pillars 20, contacts 70, and the bit lines 29. An insulating layer 61 is provided between the substrate 10 and the stacked body 25a.

Multiple electrode layers WL and multiple insulating layers 60 are provided in the stacked body 25a. The multiple electrode layers WL are stacked to be separated from each other; and the multiple insulating layers 60 are provided between the multiple electrode layers WL. For example, the multiple electrode layers WL and the multiple insulating layers 60 are stacked alternately layer by layer. Any number of stacks of the electrode layers WL and the insulating layers 60 are stacked.

The multiple silicon pillars 20 that extend in the Z-direction are provided inside the stacked body 25a. The silicon pillars 20 extend in the Z-direction and are buried in the insulating layers 60 and the electrode layers WL included in the memory cells. Also, memory films 20a are provided around the silicon pillars 20 from the outer circumferential sides. For example, the memory film 20a is a stacked film that includes a tunneling insulating film, a charge storage film, and a blocking insulating film. The silicon pillars 20 and the memory films 20a extend to be continuous in the Z-direction.

The multiple bit lines 29 are provided on the stacked body 25a. The upper end portions of the silicon pillars 20 are connected to the bit lines 29 via contacts 80 and contacts 81. Inter-layer insulating layers 62 and 63 are provided between the stacked body 25a and the bit lines 29. The contacts 80 and the contacts 81 are provided respectively inside the inter-layer insulating layers 62 and 63.

The contact 70 is provided to be interposed between the stacked bodies 25a and extends in the Z-direction through the stacked body 25a. The contact 70 is, for example, a metal material including tungsten as a major component. The contact 70 is connected to a source line (not shown) provided on the stacked body 25a. The contact 70 contacts the substrate 10 at the lower end of the contact 70. The lower ends of the silicon pillars 20 contact the substrate 10; and the silicon pillars 20 are electrically connected to the source line via the substrate 10 and the contact 70. The contact 70 and an insulating layer 64 that surrounds the contact 70 are provided inside a trench T.

In the case where the electrode layers WL are provided to oppose the contact 70, the electrode layers WL include first portions WL1 and second portions WL2 in order to decrease the difference of the electrode layer WL widths W4 in the X-direction between layers. In such a case, for example, the widths W4 in the X-direction of the electrode layers WL can be set to be uniform by planarizing the second portions WL2 of the electrode layers WL.

Accordingly, in the semiconductor device 100, the electrode layers WL that include the first portions WL1 and the second portions WL2 are separated from each other by the interconnect formation method of the first embodiment.

Fifth Embodiment

Figure 11:
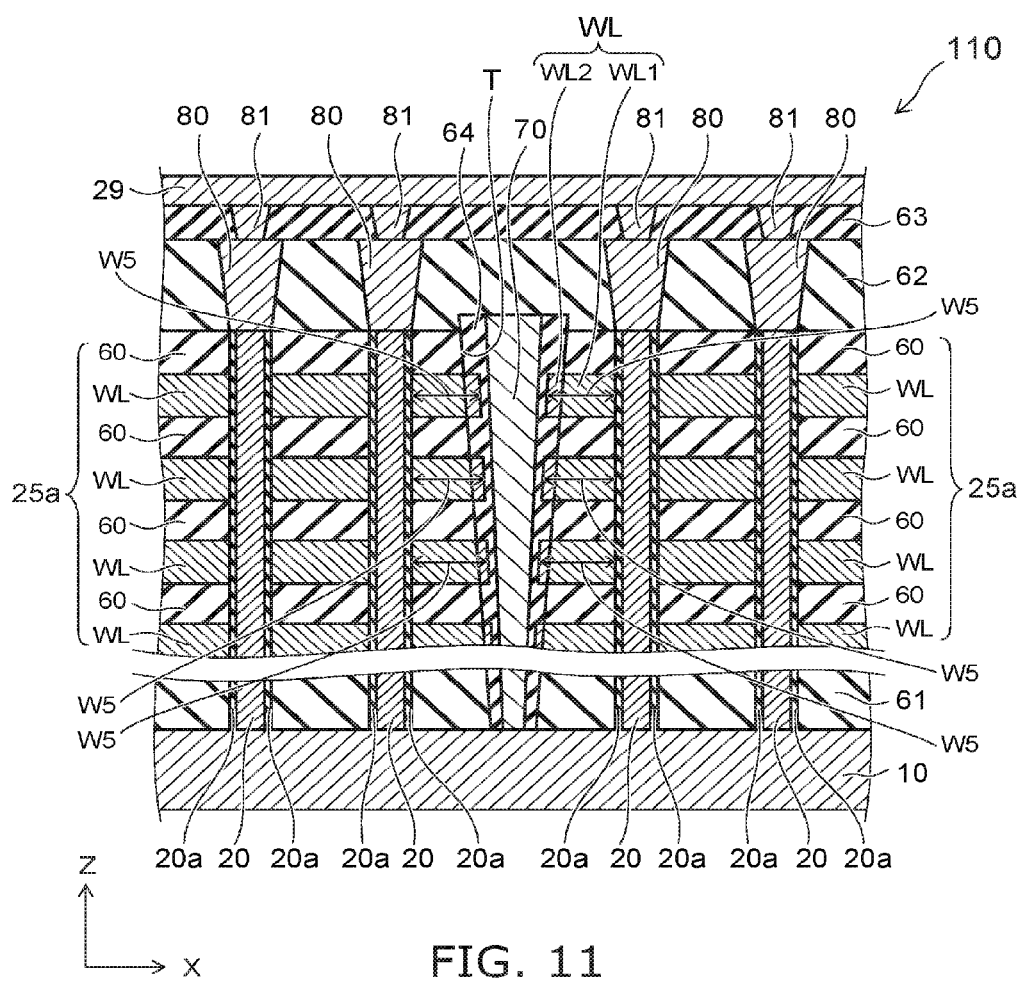
FIG. 11 is a schematic cross-sectional view showing a semiconductor device according to a fifth embodiment.

FIG. 11 is a schematic cross-sectional view showing a semiconductor device according to a fifth embodiment.

The electrode layers WL of the semiconductor device of the embodiment are different from those of the semiconductor device of the fourth embodiment. Other than the electrode layers WL, the configuration is the same as that of the semiconductor device of the fourth embodiment, therefore, a detailed description of the configurations which both embodiments have in common are omitted.

As shown in FIG. 11, the contact 70 and the insulating layer 64 that is provided around the contact 70 are provided inside the trench T. The narrower width of the trench T decreases from the upper layers to the lower layers.

In the case where the electrode layers WL are provided to oppose the contact 70, the electrode layers WL include the first portions WL1 and the second portions WL2 in order to decrease the difference of the electrode layer WL widths W5 in the X-direction between layers. In such a case, the second portions WL2 of the electrode layers WL, which are fabricated inside the insulating layer 64, are formed to be thick at the upper layers and thin at the lower layers.

Accordingly, in the semiconductor device 110, the electrode layers WL that include the first portions WL1 and the second portions WL2 are separated from each other by the interconnect formation method of the second embodiment.

The interconnect structures and the interconnect formation methods illustrated in the embodiments described above are not limited to a semiconductor memory device and are also applicable to other semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor substrate;
   a first insulating film extending in a first direction and a second direction crossing the first direction;
   a first stacked body provided above the semiconductor substrate, the first stacked body including first films and second films stacked alternately in the first direction, one of the second films including a first conductive film and a second conductive film, the second conductive film contacting the first conductive film, the second conductive film having a surface contacting the first insulating film in the second direction; and
   a second stacked body provided above the semiconductor substrate, the second stacked body including third films and fourth films stacked alternately in the first direction, the third films being opposite to the first films through the first insulating film, the fourth films being opposite to the second films through the first insulating film, one of the fourth films including a third conductive film and a fourth conductive film, the third conductive film contacting the fourth conductive film, the fourth conductive film having a surface contacting the first insulating film in the second direction,
   the second films protruding toward an inside of the first insulating film and protruding in the second direction to form protruding portions, and
   thicknesses of the protruding portions of the second films in the second direction decreasing gradually from upper films in the first stacked body to lower films.

2. The semiconductor device according to claim 1, wherein the first films and the third films are insulative.

3. The semiconductor device according to claim 1, wherein
   the first films and the third films are silicon oxide films, and
   the second films and the fourth films include tungsten.

4. The semiconductor device according to claim 1, further comprising:
   a semiconductor pillar extending in the first direction; and
   a memory film provided between the semiconductor pillar and the second films.

5. The semiconductor device according to claim 1, further comprising:
a semiconductor pillar extending in the first direction;
a plurality of fifth films provided between the semiconductor pillar and the second films and arranged to be separated from each other along the first direction; and
a second insulating film provided between the second films and the fifth films, the second insulating film covering upper and lower surfaces of the first conductive film,
the second films protruding toward an inside of the first insulating film.

6. The semiconductor device according to claim 1, wherein the second conductive film of the one of the second films protrudes in the second direction.

7. The semiconductor device according to claim 1, wherein, the first insulating film provided between the first stacked body and the second stacked body, a width of the first insulating film in the second direction positioned at upper sides of the first and second stacked bodies is wider than a width of the first insulating film in the second direction positioned at lower sides of the first and second stacked bodies, the lower sides of the first and second stacked bodies are closer to the semiconductor substrate in the first direction than the upper sides of the first and second stacked bodies.

8. A semiconductor device, comprising:
a semiconductor substrate;
a first insulating film extending in a first direction and a second direction crossing the first direction;
a first semiconductor pillar extending in the first direction;
a second semiconductor pillar extending in the first direction;
a first stacked body provided above the semiconductor substrate, the first stacked body being provided between the first semiconductor pillar and the first insulating film, the first stacked body including first films and second films stacked alternately in the first direction, one of the second films including a first conductive film and a second conductive film, the first conductive film being provided between the first semiconductor pillar and the second conductive film, the second conductive film having a surface contacting the first insulating film in the second direction; and
a second stacked body provided above the semiconductor substrate, the second stacked body being provided between the second semiconductor pillar and the first insulating film, the second stacked body including third films and fourth films stacked alternately in the first direction, the third films being opposite to the first films through the first insulating film, the fourth films being opposite to the second films through the first insulating film, one of the fourth films including a third conductive film and a fourth conductive film, the third conductive film being provided between the second semiconductor pillar and the fourth conductive film, the fourth conductive film having a surface contacting the first insulating film in the second direction,
the second films protruding toward an inside of the first insulating film and protruding in the second direction to form protruding portions, and
thicknesses of the protruding portions of the second films in the second direction decreasing gradually from upper films in the first stacked body to lower films.

9. The semiconductor device according to claim 8, wherein
the first conductive film contacts the second conductive film, and
the third conductive film contacts the fourth conductive film.

10. The semiconductor device according to claim 8, wherein
the first conductive film and the second conductive film contact the first film, and
the third conductive film and the fourth conductive film contact the third film.

11. The semiconductor device according to claim 8, wherein the first semiconductor pillar and the second semiconductor pillar include a second insulating film extending in the first direction.

12. The semiconductor device according to claim 8, wherein the first films and the third films are insulative.

13. The semiconductor device according to claim 8, wherein
the first films and the third films are silicon oxide films, and
the second films and the fourth films include tungsten.

14. The semiconductor device according to claim 8, further comprising:
a first memory film provided between the first semiconductor pillar and the second films; and
a second memory film provided between the second semiconductor pillar and the fourth films.

15. The semiconductor device according to claim 8, further comprising:
a plurality of fifth films provided between the first semiconductor pillar and the second films and arranged to be separated from each other along the first direction; and
a second insulating film provided between the second films and the fifth films, the second insulating film covering upper and lower surfaces of the first conductive film.

16. The semiconductor device according to claim 8, wherein the second conductive film of the one of the second films protrudes in the second direction.

17. The semiconductor device according to claim 8, wherein, the first insulating film provided between the first stacked body and the second stacked body, a width of the first insulating film in the second direction positioned at upper sides of the first and second stacked bodies is wider than a width of the first insulating film in the second direction positioned at lower sides of the first and second stacked bodies, the lower sides of the first and second stacked bodies are closer to the semiconductor substrate in the first direction than the upper sides of the first and second stacked bodies.

* * * * *